(12) United States Patent
Chen

(10) Patent No.: US 6,466,443 B1
(45) Date of Patent: Oct. 15, 2002

(54) HEAT SINK FASTENER WITH PIVOTABLE SECURING MEANS

(75) Inventor: Chun-Chi Chen, Taipei (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/915,918

(22) Filed: Jul. 26, 2001

(30) Foreign Application Priority Data

May 30, 2001 (TW) ........................................ 090208825

(51) Int. Cl.[7] ................................................ H05K 7/20
(52) U.S. Cl. .................. 361/695; 24/458; 165/80.3; 165/122; 257/719; 248/510; 361/697; 361/719
(58) Field of Search ................... 24/457–458; 165/80.2, 165/80.3, 185, 121–122; 174/16.3; 257/718–719, 726–727; 248/505, 510; 361/690, 687, 694–697, 704, 707, 709–710, 719–720, 825, 829, 177–178

(56) References Cited

U.S. PATENT DOCUMENTS

| 5,943,209 | A | * | 8/1999 | Liu | 361/695 |
| 6,181,559 | B1 | * | 1/2001 | Seo | 361/704 |
| 6,311,766 | B1 | * | 11/2001 | Liu et al. | 361/697 |
| 6,318,452 | B1 | * | 11/2001 | Lee | 165/80.3 |

* cited by examiner

Primary Examiner—Gregory Thompson
(74) Attorney, Agent, or Firm—Wei Te Chung

(57) ABSTRACT

A fastener (1) securing a heat sink (50) and an electrical fan (40) to a CPU (70) includes a pressing frame (10), a pair of activating members (20) and a pair of locking members (30). The fastener cooperates with a retention module (60) to receive the heat sink and the fan therein. The activating members are pivotally attached to opposite lateral sides of the pressing frame. The locking members are pivotally attached to the activating members. When the activating members are upwardly and inwardly rotated, the locking members rise accordingly. Thus the locking members pressingly engage with the retention module, and the pressing frame firmly presses the fan. The heat sink is thereby firmly secured to the CPU with the fastener.

19 Claims, 6 Drawing Sheets

HEAT SINK FASTENER WITH PIVOTABLE SECURING MEANS

BACKGROUND OF THE INVENTION

1. Field of the Invention

The present invention relates to fasteners for securing heat sinks, and particularly to fasteners which conveniently and firmly secure a heat sink to an electronic device.

2. Description of Prior Art

Computer electronic devices such as central processing units (CPUs) frequently generate great amounts of heat. Oftentimes, a heat sink is attached onto a top surface of a CPU by using any of a variety of currently available fasteners. By removing heat from the CPU, the heat sink protects the CPU and associated components from instability and damage.

Continued development of CPUs has enabled them to perform more and more functions. Correspondingly, heat typically generated from CPUs is constantly increasing, and heat sinks are being made larger and larger. It is now commonplace that a single conventional fastener cannot adequately attach a heat sink onto a CPU. Shock or vibration occurring during the normal course of operation of a computer frequently displaces the heat sink relative to the CPU.

At least two fasteners are commonly needed to prevent such displacement. FIG. 6 shows two conventional fasteners 2 securing a heat sink 3 to a CPU mounted on a printed circuit board (PCB). A pair of retention modules 4 is mounted on the PCB, on opposite sides of the CPU. Opposite ends of each fastener 2 are engaged with opposite catches formed on the corresponding retention module 4. One fastener 2 is secured first, and then the other fastener 2 is secured. The heat sink 3 is thus attached to the CPU.

A pressing point of any such conventional fastener, which acts on the heat sink, usually does not coincide with a center of the fastener. This results in an eccentric moment occurring between the pressing point and the center of the fastener. The eccentric moment can cause the heat sink to be dislodged from the CPU when the system is subjected to shock or vibration during normal operation, thereby reducing the efficiency of heat transfer.

Furthermore, two operations must be performed to attach or remove the two fasteners 2. This makes installation of the fasteners unduly time-consuming. Moreover, if a heat sink fan is needed to enhance heat dissipation efficiency of the heat sink, additional holders or clips are required to fasten the heat sink fan. This lengthens assembly time and increases costs.

Thus, a fastener for readily and firmly attaching a heat sink to an electronic device such as a CPU is required.

SUMMARY OF THE INVENTION

Accordingly, an object of the present invention is to provide a fastener which can readily and firmly secure a heat sink to an electronic device.

In order to achieve the object set out above, a fastener of the present invention comprises a pressing frame, a pair of activating members and a pair of locking members. The pressing frame comprises a pair of longitudinal pressing portions, and four legs depending from each end of the pressing portions. A pair of pivot flanges extends outwardly from a bottom portion of each leg. A first pivot axis is thereby defined at each of opposite lateral sides of the pressing frame. The activating members are pivotally attached to opposite lateral sides of the pressing frame. Each activating member forms a pair of pegs at each of opposite ends thereof. A second pivot axis is thereby defined at each activating member. A pair of pivot arms extends from each end of each locking member. A through hole is defined in each pivot arm, for receiving the corresponding peg of the corresponding activating member. The locking members are thereby pivotally attached to the activating members. The fastener cooperates with a retention module to receive a heat sink and a fan therein. In operation of the fastener, the activating members are upwardly and inwardly rotated about the corresponding first pivot axes of the pressing frame. The locking members are thereby upwardly rotated about the corresponding second pivot axes of the activating members. Thus the locking members pressingly engage with the retention module, and the pressing frame firmly presses the fan. The heat sink can thereby be firmly secured to a CPU mounted on a PCB.

Other objects, advantages and novel features of the present invention will become more apparent from the following detailed description when taken in conjunction with the accompanying drawings.

DETAILED DESCRIPTION OF THE INVENTION

Figure 1:
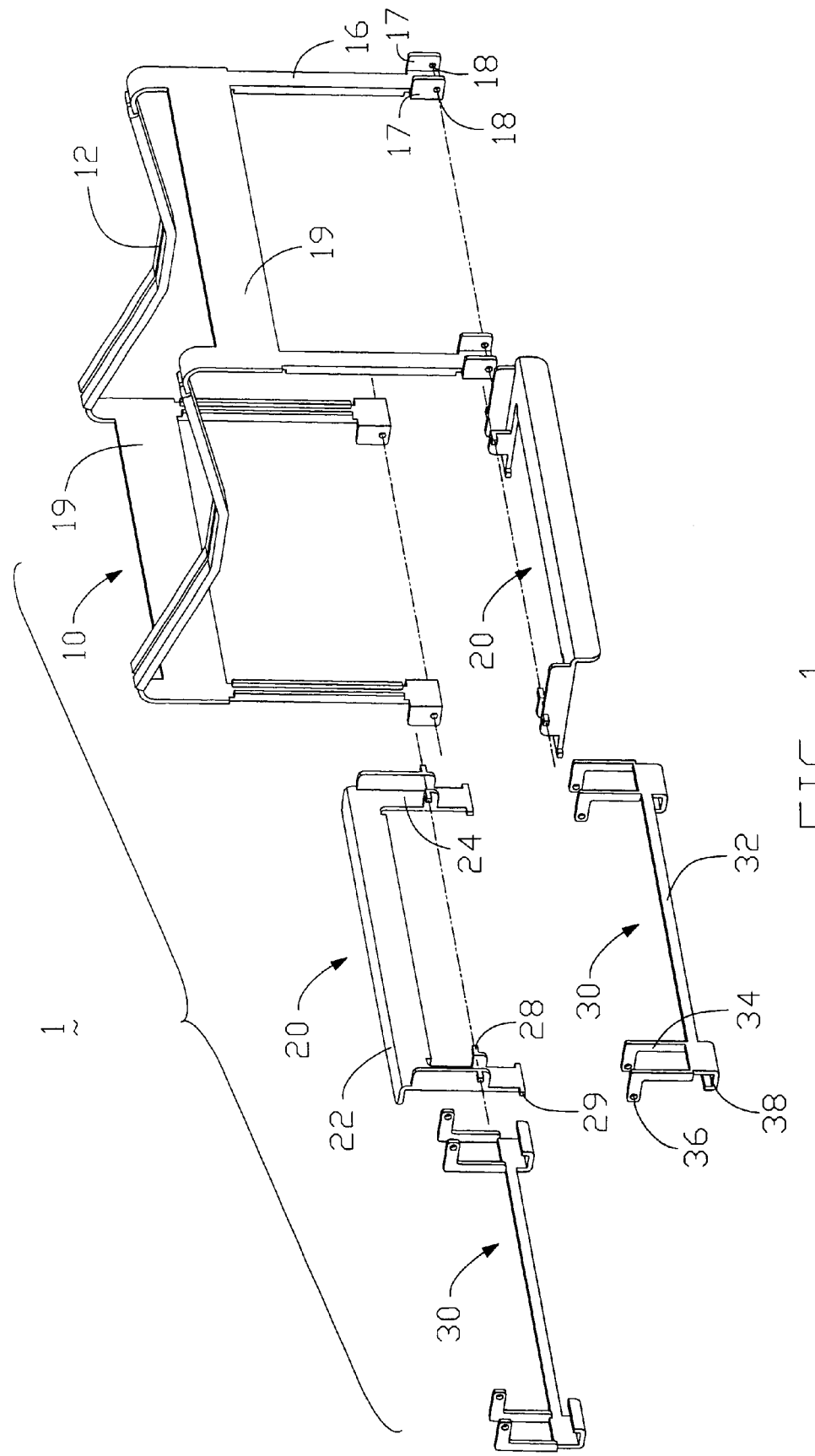
FIG. 1 is an exploded view of a fastener in accordance with the present invention.

Reference will now be made to the drawing figures to describe the present invention in detail.

Figure 2:
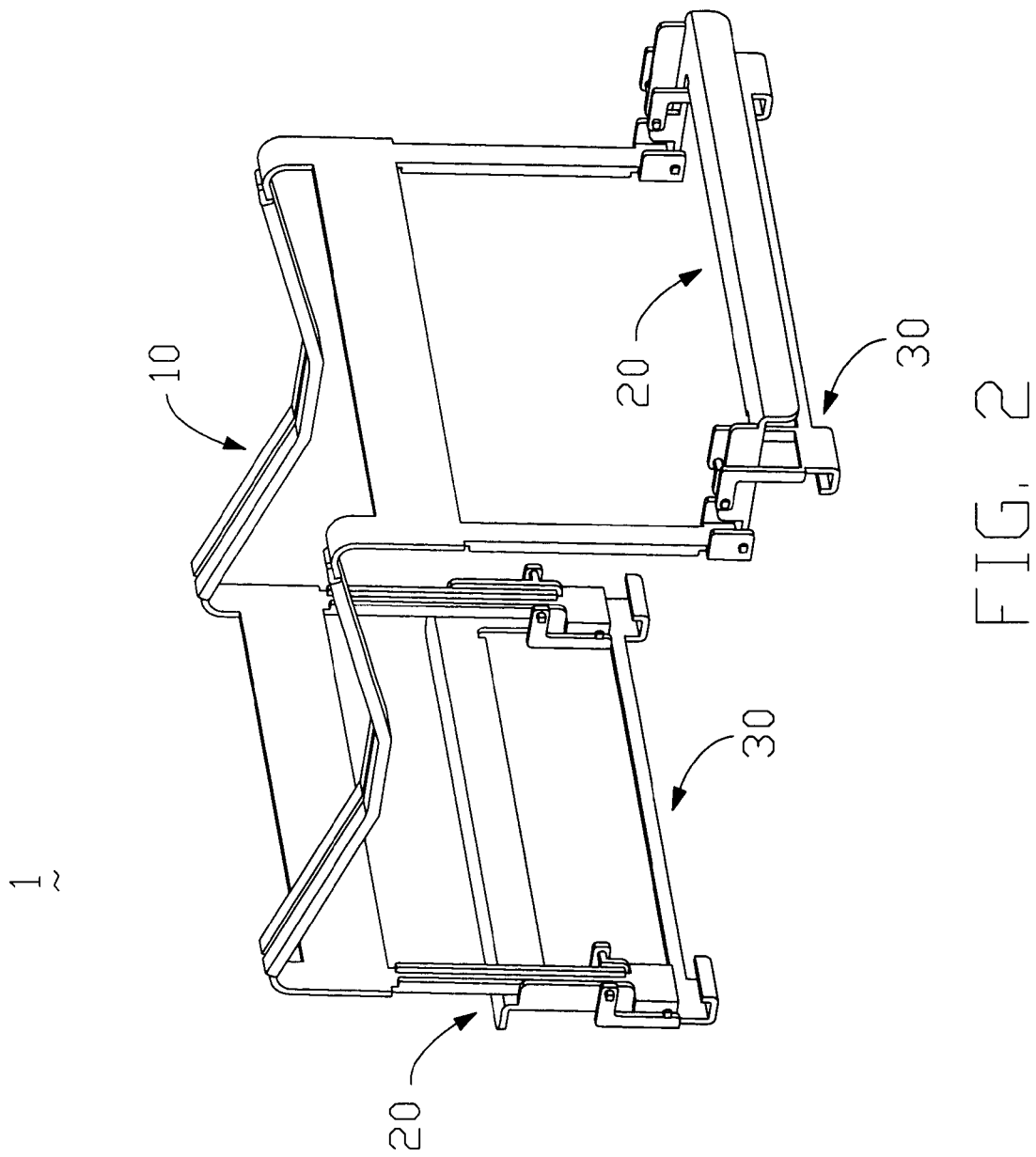
FIG. 2 is an assembled view of FIG 1.
Figure 3:
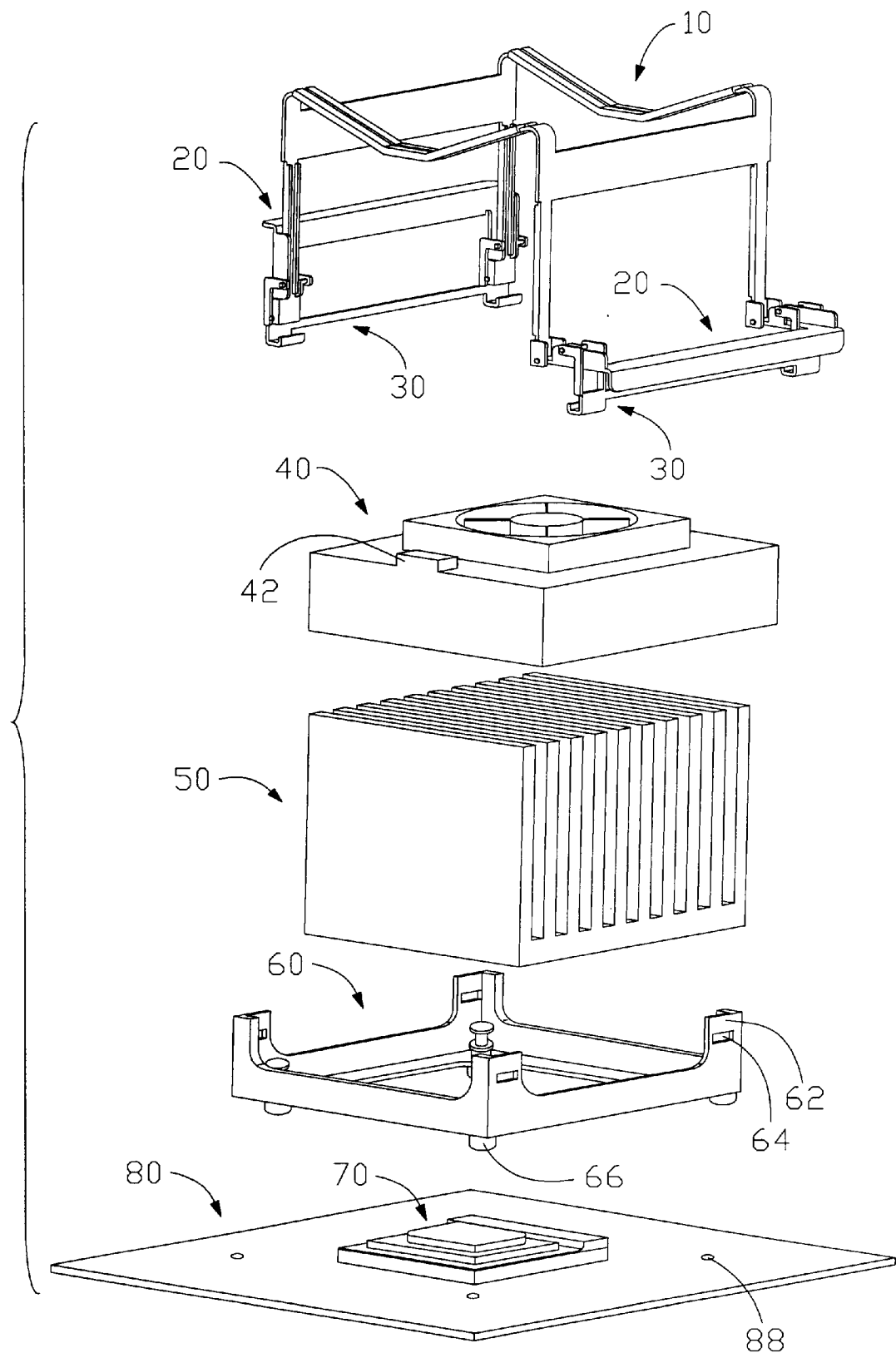
FIG. 3 is an exploded view of the fastener of FIG. 2, an electrical fan, a heat sink, a retention module, and a CPU mounted on a PCB.

Referring to FIGS. 1 to 3, a fastener 1 in accordance with the preferred embodiment of the present invention comprises a pressing frame 10, a pair of activating members 20 and a pair of locking members 30. The fastener 1 secures a heat sink 50 onto a CPU 70. The CPU 70 is mounted on a printed circuit board (PCB) 80 using a socket (not labeled). To secure the heat sink 50, the fastener 1 cooperates with a retention module 60. An electrical fan 40 is mounted on the heat sink 50.

The heat sink 50 is a conventional type. The fan 40 comprises a hollow box (not labeled) which is dimensioned to closely cover an upper portion of the heat sink 50. A pair of support portions 42 is upwardly formed on opposite sides respectively of a top portion of the fan 40.

The PCB 80 defines four bores 88 near four corners of the CPU 70 respectively. The retention module 60 has a window (not labeled) defined in a middle portion thereof. The retention module 60 downwardly forms four pins 66 at four corners thereof respectively. The retention module 60 upwardly forms four engaging portions 62 at four corners thereof respectively, with each engaging portion 62 being generally opposite to its corresponding pin 66. Each engaging portion 62 defines an opening 64, such that one pair of openings 64 is coplanar and opposes an opposite pair of coplanar openings 64.

Referring particularly to FIG. 1, the pressing frame 10 of the fastener 1 comprises a pair of longitudinal parallel U-shaped pressing portions 12, four legs 16 depending from opposite ends of each of the pressing portions 12 respectively, and a pair of parallel beams 19 at opposite lateral sides of the pressing frame 10. Each beam 19 laterally connects the corresponding pair of legs 16. A pair of parallel pivot flanges 17 is outwardly and longitudinally formed at a bottom end of each leg 16. A pivot hole 18 is defined near a bottom end of each pivot flange 17. Four pivot holes 18 of two legs 16 at one lateral side of the pressing frame 10 are aligned and coaxial with each other, thereby defining a first pivot axis. Four pivot holes 18 of two legs 16 at an opposite lateral side of the pressing frame 10 are aligned and coaxial with each other, thereby defining another first pivot axis.

Each activating member 20 of the fastener 1 comprises a horizontal operation portion 22 for facilitating operation of the activating member, and a pair of pivot portions 24 depending from opposite ends of the operation portion 22 respectively. A pair of dowels 29 is formed at opposite sides of a distal end of each pivot portion 24 respectively, for engaging in the pivot holes 18 of the corresponding legs 16 of the pressing frame 10. A pair of pegs 28 is formed at opposite sides of each pivot portion 24 above the dowels 29. The four pegs 28 of each activating portion 20 are aligned and coaxial with each other, thereby defining a second pivot axis.

Each locking member 30 of the fastener 1 has a horizontal connect portion 32. A pair of parallel L-shaped pivot arms 34 extends vertically upwardly from each end of the connect portion 32. A through hole 36 is defined in a distal end of each pivot arm 34, for receiving the corresponding peg 28 of the corresponding activating member 20. The through holes 36 of the pivot arms 34 are aligned and coaxial with each other. A catch 38 depends from each end of the connect portion 32, generally opposite the corresponding pair of pivot arms 34. The catches 38 are U-shaped in profile, and correspond to the openings 64 of the retention module 60.

Referring to FIGS. 1 and 2, in assembly of the fastener 1, the dowels 29 of each activating member 20 are inserted into the pivot holes 18 of the corresponding legs 16 of the pressing frame 10. The pegs 28 of each activating member 20 are then inserted into the through holes 36 of the corresponding locking member 30. The pressing frame 10, the activating members 20 and the locking members 30 are thus assembled together to form the fastener 1. Each activating member 20 can be pivotally rotated about the corresponding first pivot axis of the pressing frame 10. Each locking member 30 can thereby be pivotally rotated about the second pivot axis of the corresponding activating member 20. Therefore, each second pivot axis can itself pivotally rotate about the corresponding first pivot axis.

Figure 4:
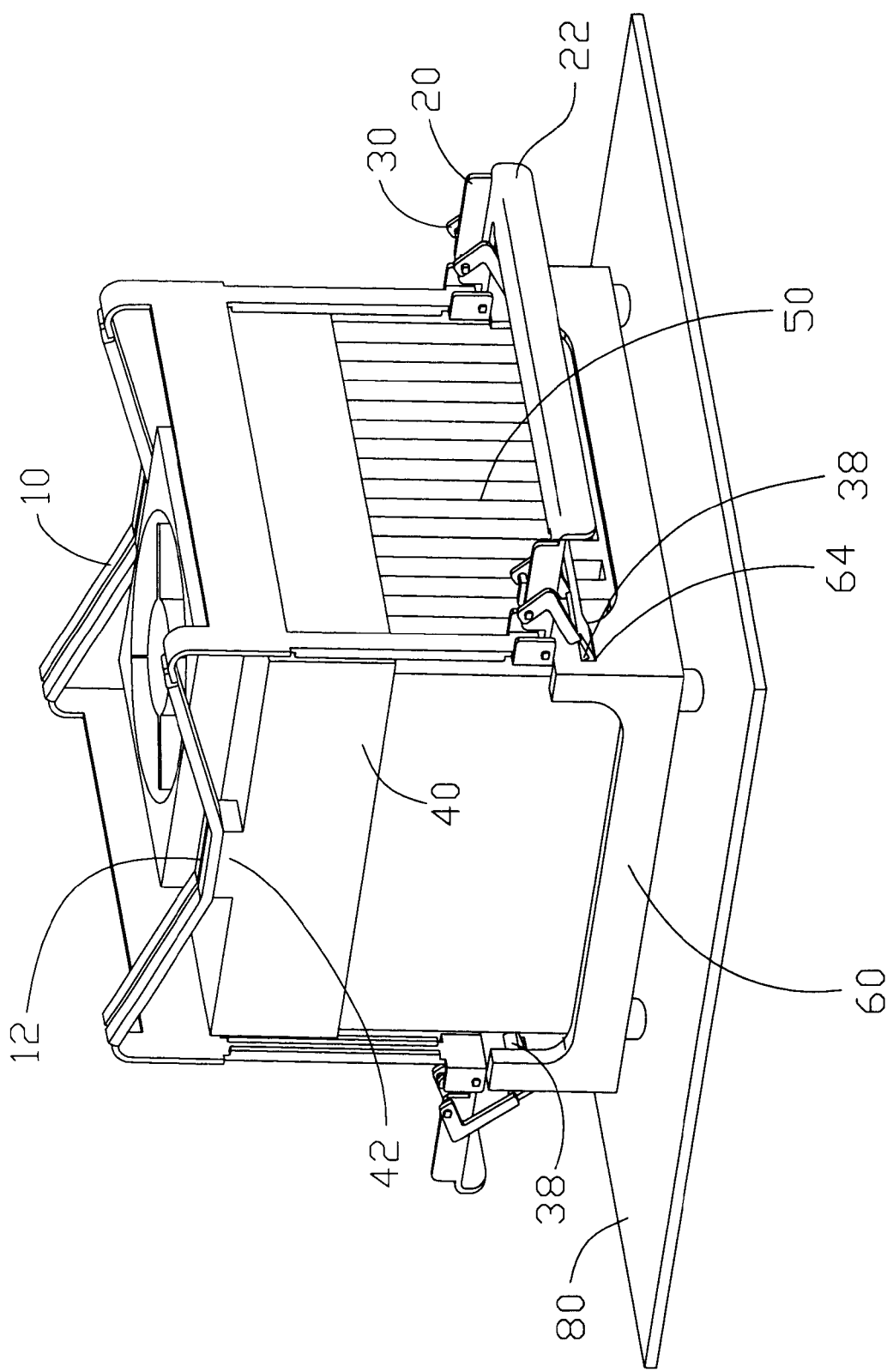
FIG. 4 is a partly assembled view of FIG. 3, showing the fastener loosely securing the fan and heat sink onto the CPU.
Figure 5:
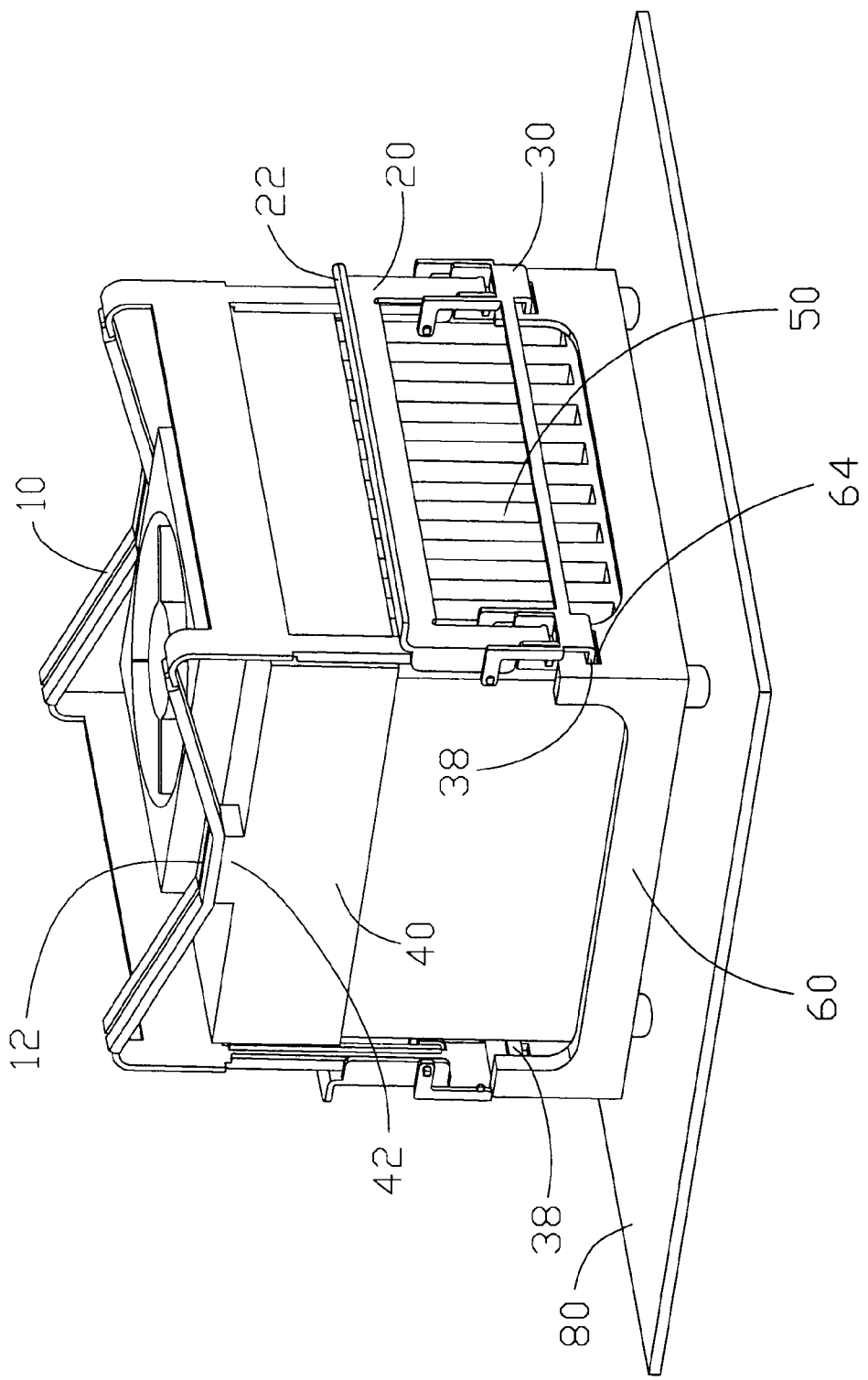
FIG. 5 is a fully assembled view of FIG. 3, showing the fastener firmly securing the fan and heat sink onto the CPU.
Figure 6:
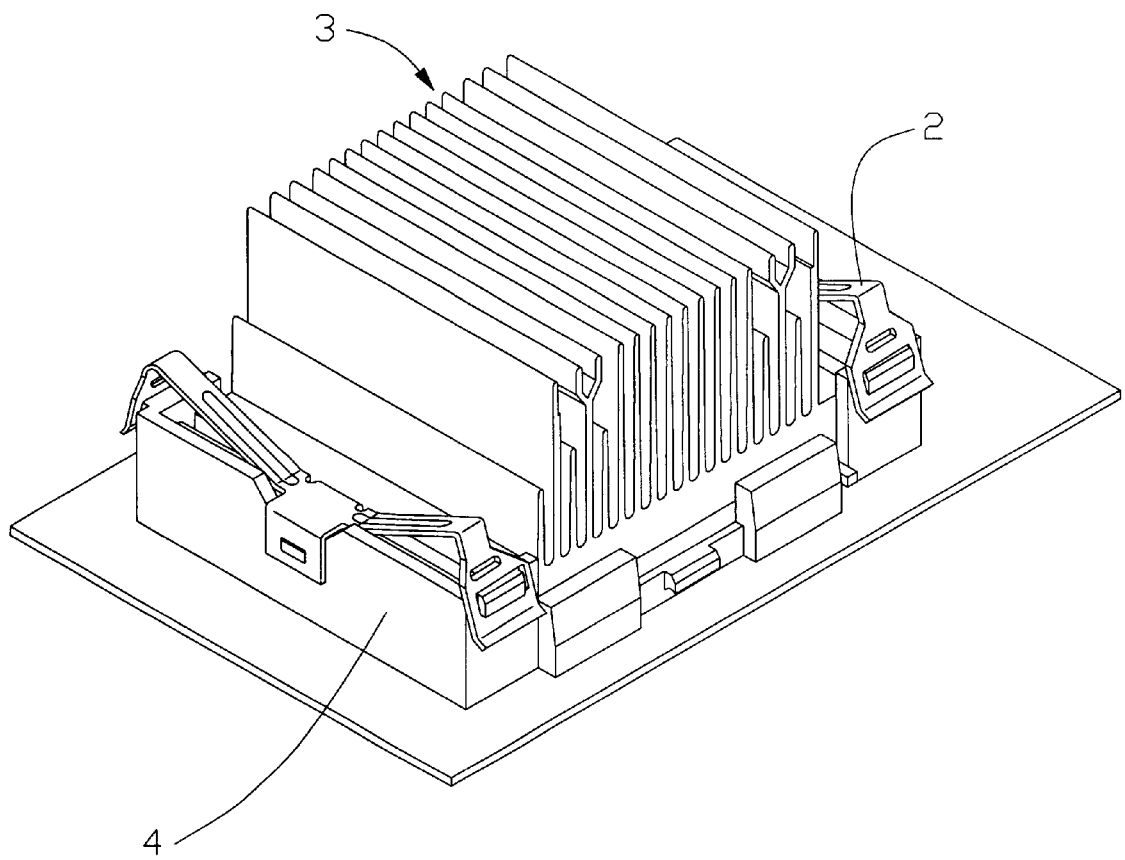
FIG. 6 is an assembled view of a pair of conventional fasteners engaged with a pair retention modules to secure a heat sink onto a CPU mounted on a PCB.

Referring to FIGS. 3 to 5, in operation, the pins 66 of the retention module 60 are inserted into the bores 88 of the PCB 80. The retention module 60 thus surrounds the CPU 70 and the socket (not labeled). The heat sink 50 is then placed onto the retention module 60. The fan 40 is placed onto the heat sink 50 to cover an upper portion of the heat sink 50. The fastener 1 is placed onto the fan 40. The pressing portions 12 of the fastener 1 abut the support portions 42 of the electrical fan 40. The fastener 1 cooperates with the retention module 60 to receive the heat sink 50 and the fan 40 therein. The catches 38 of the locking members 30 are loosely engaged in the openings 64 of the retention module 60. The pivot portions 24 of the activating members 20 lie in substantially horizontal positions (see FIG. 4).

The operation portions 22 of the activating members 20 are simultaneously pulled upwardly and inwardly, thereby causing each activating member 20 to pivotally rotate about its dowels 29. That is, each activating member 20 rotates about the corresponding first pivot axis of the pressing frame 10. The second pivot axis of each locking member 30 accordingly rises, and the pegs 28 of the activating members 20 pull up the pivot alms 34 of the locking members 30. In this process, the second pivot axis of each activating member 20 pivotally rotates about the corresponding first pivot axis of the pressing frame 10. The operation portions 22 are continued to be so pulled until the activating members 20 abut against the corresponding legs 16 of the pressing frame 10. The catches 38 of the locking members 30 pressingly and firmly engage in the openings 64 of the retention module 60. The pressing portions 12 of the pressing frame 10 firmly press against the support portions 42 of the fan 40. The heat sink 50 is thereby securely fastened onto the CPU 70 by the fastener 1 (see FIG. 5).

In detachment of the heat sink 50, the operation portion 22 of each activating member 20 is pushed outwardly and downwardly. The catches 38 of the locking members 30 are thereby released from the openings 64 of the retention module 60.

In operation of the fastener 1, the activating members 20 are simultaneously rotated. This saves time. Furthermore, this process efficiently avoids an eccentric moment being created between either of the pressing portions 12 and a central portion of the fastener 1. Moreover, the fan 40 can be conveniently incorporated into the system without the need for additional clips or holders. In summary, the fastener 1 easily, conveniently and firmly secures a sink to a CPU.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fastener for securing a heat sink to a CPU, the fastener comprising:

a pressing frame comprising a pair of longitudinal pressing portions adapted for pressing the heat sink onto the CPU, four legs depending from respective ends of the pressing portions, at least one pivot flange outwardly formed at a bottom portion of each leg, a first pivot axis being defined at each of opposite lateral sides of the pressing frame;

a pair of activating members pivotally attached to opposite lateral sides of the pressing frame, each activating member forming at least one pair of dowels engaging with the pressing frame at a corresponding first pivot axis of the pressing frame, and further forming at least one pair of pegs which together define a second pivot axis; and a pair of locking members adapted for securely engaging with a fixture beside the CPU, each locking member comprising at least one pair of pivot arms extending upwardly therefrom, each pivot arm defining a through hole therein for receiving a corresponding peg of the corresponding activating member, the locking members thereby being pivotally attached to the activating members.

2. The fastener in accordance with claim 1, wherein the activating members are pivotally rotated about the first pivot axes of the pressing frame, and wherein the locking members are pivotally rotated about the second pivot axes of the activating members.

3. The fastener in accordance with claim 1, wherein a pair of parallel beams is formed at the opposite lateral sides of the pressing frame, each beam laterally connecting a corresponding pair of legs.

4. The fastener in accordance with claim 1, wherein a pivot hole is defined in each pivot flange, and the pivot holes at each of the opposite lateral sides of the pressing frame are aligned and coaxial with each other, thereby defining the first pivot axis at each of the opposite lateral sides of the pressing frame.

5. The fastener in accordance with claim 1, wherein each pressing portion is generally U-shaped.

6. The fastener in accordance with claim 1, wherein each activating member comprises a horizontal operation portion for facilitating operation of the activating member, and a pair of pivot portions depending from opposite ends of the operation portion.

7. The fastener in accordance with claim 6, wherein the dowels of the activating members are formed at opposite sides of each pivot portion.

8. The fastener in accordance with claim 6, wherein the pegs of the activating members are formed at opposite sides of each pivot portion.

9. The fastener in accordance with claim 1, wherein the pegs of the activating members are disposed above the dowels of the activating members.

10. The fastener in accordance with claim 1, wherein each locking member further comprises a connect portion, and wherein the at least one pair of pivot arms extends from at least one of opposite ends of the connect portion.

11. The fastener in accordance with claim 1, wherein each pivot arm of the locking members is L-shaped.

12. The fastener in accordance with claim 1, wherein the through holes of the pivot arms are defined in distal ends of the pivot arms.

13. The fastener in accordance with claim 1, wherein at least one catch depends from at least one of opposite ends of each locking member, each catch being located opposite to the corresponding pair of pivot arms and adapted for securely engaging with the fixture.

14. A heat dissipation assembly comprising:
   a CPU;
   a PCB supporting the CPU thereon;
   a retention module mounted on the PCB and surrounding the CPU, the retention module comprising four engaging portions at four corners thereof, each engaging portion defining an opening therein;
   a heat sink attached to the CPU;
   an electrical fan placed onto the heat sink; and
   a fastener mounted on the fan and cooperating with the retention module to receive the heat sink and the fan therein, the fastener comprising a pressing frame, a pair of activating members pivotally attached to opposite lateral sides of the pressing frame, and a pair of locking members pivotally engaged with the activating members, the pressing frame downwardly pressing the fan, each locking member having a pair of catches depending therefrom;
   wherein when the activating members are upwardly and inwardly rotated, the locking members rise and cause the catches to firmly engage in the openings of the retention module, the heat sink thereby being firmly secured to the CPU.

15. The heat dissipation assembly in accordance with claim 14, wherein at least one pair of bores is defined in the PCB near at least one pair of opposite corners of the CPU respectively, and at least one pair of pins depends from the retention module and engages in the bores of the PCB.

16. A fastener for securing a heat sink to an electronic device, comprising:
   a pressing frame comprising a pressing portion adapted for exerting a pressing force to the heat sink, and a leg portion defining a first pivot axis;
   an activating member mounted to the leg portion of the pressing frame and pivotable about the first pivot axis, the activating member defining a second pivot axis; and
   a locking member being adapted for engaging with a fixture located beside the electronic device the locking member being mounted to the activating member and pivotable about the second axis;
   wherein when the activating member is pivoted about the first pivot axis in a direction toward the pressing frame, the locking member also moves toward the pressing frame.

17. The fastener in accordance with claim 16, wherein the activating member forms a horizontal operation portion for facilitating operation of the activating member, and wherein the second pivot axis is located between the horizontal operation portion and the first pivot axis.

18. The fastener in accordance with claim 17, wherein the locking member has a catch adapted for engaging with the fixture, the catch being below and distal from a point of mounting of the locating member to the activating member, and wherein when the activating member is pivoted about the first axis toward the pressing frame, the catch moves upwardly toward the pressing frame.

19. The fastener in accordance with claim 18, wherein the catch has a generally U-shaped profile.

\* \* \* \* \*